April 4, 1967 M. M. A. A. G. VERSTRAELEN 3,312,834

SHORT DURATION PULSE GENERATOR
UTILIZING AVALANCHE BREAKDOWN
Filed Oct. 18, 1963

INVENTOR.
MARIE M.A.A.GH. VERSTRAELEN
BY
Frank R. Jeifari
AGENT

United States Patent Office 3,312,834
Patented Apr. 4, 1967

3,312,834

SHORT DURATION PULSE GENERATOR UTILIZING AVALANCHE BREAKDOWN

Marie Marcel Antoine Arnold Ghislain Verstraelen, Hilversum, Netherlands, assignor to North American Philips Company, Inc., New York, N.Y., a corporation of Delaware Filed Oct. 18, 1963, Ser. No. 317,240
Claims priority, application Netherlands, Nov. 13, 1962, 285,459
8 Claims. (Cl. 307—88.5)

This invention relates to a pulse generator including a capacitor the charge of which is abruptly changed by means of an avalanche breakdown through the emitter-collector path of a transistor connected in series with the capacitor.

Such pulse generators are known, in particular from "R.C.A. Review," March 1955, pages 16 to 33, and from "Radio-technik," vol. 10/11, 1955, pages 315 to 319. By the use of the avalanche effect, it has been found possible to produce current pulses and/or voltage pulses having an extremely short duration and leading edge. Such pulses are used in modern engineering, for example, in so-called radar equipment or in high-speed computers.

After the charge of the capacitor of such a generator has been changed by means of avalanche breakdown in the transistor, as a result of which the desired sharp pulse is produced, it must be restored to its original condition of charge, so that the generator is ready again for producing the next pulse. In known circuits this is usually effected through a resistor. This resistor or other circuitry for re-establishing the initial charge condition constitutes a load for the transistor or the capacitor circuit and must therefore have an impedance which is not excessively small. Otherwise overload of the avalanche transistor and/or a reduction in the amplitude of the pulses are produced. This circumstance limits the repetition frequency of the sharp pulses produced. With known circuits and avalanche transistors, a repetition frequency of 10 mc./s. cannot be readily exceeded.

An object of the invention is to increase the repetition frequency of a pulse generator of the kind defined in the preamble and to ensure that the path for the change of charge of the capacitor does not cause the generator, more particularly the avalanche transistor, to be loaded during the change of charge or the production of the sharp pulse.

According to the invention, this object is attained in that after each pulse produced, the charge of the capacitor is changed in opposite directions through the series-combination of an inductance and the, normally conducting, emitter-collector path of a control transistor. To the input circuit of the transistor reverse pulses are applied which cut-off the transistor. The reverse voltage pulses produced across the inductance upon cutting off the control transistor are applied to the base of the avalanche transistor and initiate the avalanche breakdown through the transistor.

In such a pulse generator, the impedance of the circuit for changing the charge of the capacitor may be very low, since the avalanche breakdown is initiated by the blocking of the control transistor, so that this transistor is cut-off during the avalanche breakdown and cannot load the avalanche transistor, nor the circuit of the capacitor. Due to this fact, such a pulse generator may be successfully operated at pulse repetition frequencies of the order of 100 mc./s.

The capacitor is usually included as a series-element in the emitter circuit of the avalanche transistor in a manner known per se in similar generators. In this event, the inductance is preferably connected to the common point of the capacitor and the emitter circuit of the avalanche transistor, whilst the base of this transistor is connected to the other end of said indutcance.

In order that the invention may be readily carried into effect, it will now be described more fully, by way of example, with reference to the accompanying diagrammatic drawing, in which FIGURE 1 shows the diagram of a first embodiment of the pulse generator in accordance with the invention;

Figure 1:
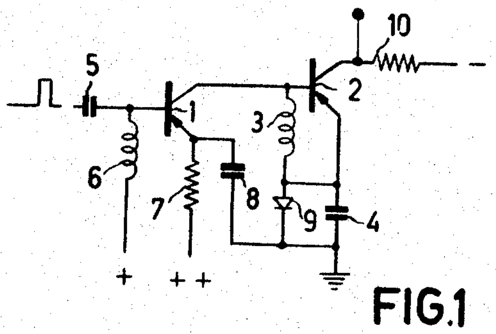

The pulse generator shown in FIGURE 1 is controlled by positive pulses having a high repetition frequency of, for example, 100 mc./s. It serves to produce extremely short and steep pulses of the same repetition frequency, for example for time marking in a radar system or for controlling an ultra-high speed computer. It comprises a control transistor 1, preferably a fast-operating switching transistor, for example of the type ASZ 21, and an avalanche transistor 2, for example of the type ASZ 23. The positive control pulses are applied to the base of transistor 1 through a capacitor 5 of, for example 50 pfs. The base is also connected to the positive terminal (+) of a first bias-voltage source of, for example, 6 volts through an inductance 6 of, for example 2 μh.

The emitter of said transistor is connected through a resistor 7 of, for example, 330 ohms to the positive terminal (++) of a second bias-voltage source of, for example, 12 volts, and also to ground through a decoupling capacitor 8 of, for example, 100 pfs. The collector of transistor 1 is connected directly to the base of transistor 2 and, through an inductance 3 of from 0.5 to 2 μh, for example 1 μh, to the emitter of said transistor. A capacitor 4 of, for example, 10 pfs. is included in series in the emitter circuit of the avalanche transistor 2 and is shunted by a diode 9, connected in the reverse direction with respect to the emitter current of said transistor. The diode 9 must have a low pass resistance and its capacity must preferably be small with respect to that of the capacitor 4, since otherwise the effective capacity of the combination 4–9 could greatly vary with the temperature and/or the voltage across the diode 9, and hence with the voltage of the second bias-voltage source. These conditions are fulfilled most satisfactorily by a high quality silicon diode.

Finally, the collector of transistor 2 is connected through a current-limiting resistor 10 of, for example, 10 ohms to the negative terminal (−) of a supply source of, for example, 18 volts.

Figure 3:
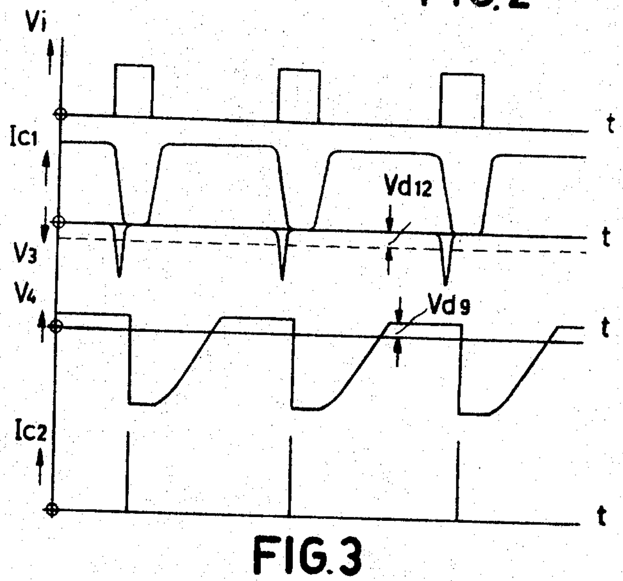
FIGURE 3 illustrates voltage-time and current-time diagrams to explain the operation of these embodiments.

The transistor 1 is cut-off by positive control pulses $V_1$ (first line of FIGURE 3) since, due to the presence of the capacitor 8, the potential of its emitter cannot increase abruptly. The time constant of the network comprising the resistor 7 and the capacitor 8 must therefore be of the same order of magnitude as the duration of the input pulses. The input network comprising the capacitor 5 and the inductance 6 must be capable of transmitting these pulses to the base of transistor 1 substantially without distortion. The collector current $I_{c1}$ of transistor 1 flows to ground through the inductance 3 and the diode 9, the voltage across the capacitor 4 being maintained at a value equal to the forward voltage drop $V_{d9}$ across the diode (fourth line of FIGURE 3).

At the moment when the collector current $I_{c1}$ (second line of FIGURE 3) is restored from its no-load value of, for example, 20 m.amps., to zero by means of a positive input pulse $V_1$, a reverse voltage pulse $V_3$ (second line of FIGURE 3) appears across the inductance 3, which pulse has an amplitude equal to $$L_3\frac{dI_{c1}}{dt}$$

This negative voltage pulse which is active between the base and the emitter of transistor 2, makes this transistor conducting. Since its collector supply voltage exceeds the minimum avalanche voltage (15 volts) and the collector resistor 10 has a very low value, an avalanche breakdown takes place between its collector and its emitter. As a result of this breakdown, the charge of the capacitor 4 is changed very rapidly, as shown by $V_4$ on the fourth line of FIGURE 3. At this time diode 9 is cut off and the avalanche current flows solely to the capacitor 4 thereby producing a sharply rising duration current pulse as shown at $I_{c2}$ on the fifth line of FIG. 3. The peak current of the avalanche discharge is limited by the resistor 10 which also serves as a load impedance and across which a voltage pulse appears having the wave shape of the current pulse $I_{c2}$. With the embodiment shown in FIGURE 1, a pulse width of only 3 nanoseconds and a rising time less than 1 nanosecond were obtained. Consequently, the collector current pulses in the avalanche transistor 2 are merely represented on the last line of FIGURE 3 by vertical line portions.

At the conclusion of the positive input pulse $V_1$, the collector current $I_{c1}$ of the transistor $T_1$ increases again and soon attains its no-load value. The charge of the capacitor 4 is then changed comparatively very rapidly, until the diode 9 again becomes conducting and limits the voltage of opposite polarity across the capacitor 4. The positive pulse produced across the inductance 3 by the trailing edge of the current pulse $I_{c1}$ does not influence the transistor 2, which in the meantime has again become non-conducting long before, that is to say at the end of the negative pulse $V_c$ across the inductance 3.

Summarizing the foregoing, it will be noted that the capacitor 4 is charged through transistor 2 while at the same time transistor 1 is blocked. As a result damping of the capacitor by the discharge circuit constituted by the series combination of the inductance 3, the transistor 1 and the resistor 7 bridged by the capacitor 8 is avoided. Consequently, the produced current pulses $I_{c2}$ are extremely short and steep at a very small loading of transistor 2. Since the charge can also be changed very rapidly, the pulse repetition frequency can be very high.

Figure 2:
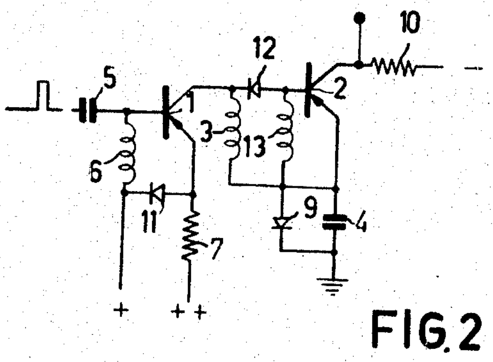
FIGURE 2 shows the diagram of a second embodiment.

In the second embodiment shown in FIGURE 2, the capacitor 8 has been replaced by a diode 11, preferably a silicon diode of low capacity, connected in the forward direction between the emitter of transistor 1 and the positive terminal (+) of the first bias-voltage source. Moreover, a third diode 12 is connected between the collector of transistor 1 and the base of transistor 2 in the forward direction with respect to the forward base current of this avalanche transistor. The base is connected to the emitter of transistor 2 through a third inductance 13. The diode 12 is preferably also a silicon diode of low capacity and must especially have as high a blocking resistance as possible.

In the rest condition, a considerable current of, for example, 15 m.amps. flows through resistor 7, the emitter-collector circuit of transistor 1, the inductance 3 and the diode 9 to ground, and a smaller current of, for example, about 1 m.amp. flows through resistor 7 and diode 11 to the positive terminal (+) of the first bias-voltage source. Consequently, a voltage drop of about 5.3 volts occurs across the resistor 7 of, for example, 330 ohms. The voltage across the diode 11 is about 0.7 volt and drives the transistor 1 in the forward direction to the extent that it passes the current of 15 m.amps.

The transistor 1 is cut-off during a positive input pulse having an amplitude exceeding 0.7 volt. The full current flowing through resistor 7 now flows through the diode 11, but the voltage drop across this diode increases only by about 0.15 volt, so that the transistor 1 remains cut-off until the end of the input pulse $V_1$.

This input circuit has a sensitivity slightly lower than that of the embodiment shown in FIGURE 1, but its operation is independent of a time constant, such as that of the emitter circuit 7–8 of FIGURE 1, which may be advantageous at very high and/or variable pulse-repetition frequencies.

The coupling diode 12 guarantees a better separation of the base of transistor 2 from the collector circuit of transistor 1 during the positive control pulse $V_1$. In the cut-off state of transistor 1 it transmits the peak of the negative reverse voltage pulse $V_3$ set up across the inductance 3 of, for example, 2 $\mu$h., so that an even sharper pulse with an amplitude reduced with the threshold voltage $V_{d12}$ of the diode 12 appears across the inductance 13 of from 0.5 to 2 $\mu$h., for example, 1 $\mu$h. and is active between the emitter and the base of transistor $T_2$. The beginning of this pulse is thus slightly delayed with respect to the beginning of the pulse $V_3$ across the inductance 3. By means of the diode 12 a loading or damping of the base circuit of transistor 2 and/or of the circuit of capacitor 4 during the output current pulses by the collector circuit of transistor 1 is avoided with even greater certainty.

What is claimed is:

1. A pulse generator comprising a discharge device having an avalanche breakdown characteristic and comprising input and output electrodes, a capacitor connected in series circuit relationship with said output electrodes, means for energizing said series circuit thereby to produce a given charge condition in said capacitor upon avalanche breakdown in said device, and means alternately to initiate avalanche breakdown in said device and to produce an opposite charge condition in said capacitor, said latter means comprising a second discharge device having input and output electrodes, an inductance connected in series circuit arrangement with said last mentioned output electrodes and said capacitor and means for energizing said series circuit arrangement, means for coupling said inductance to an input electrode of said first device, means for maintaining said second device normally conducting thereby to produce said opposite charge condition in said capacitor, and means for interrupting said conduction of said second device thereby to induce a potential in said inductance actuating said first device and producing avalanche breakdown thereof.

2. A pulse generator comprising a transistor having an avalanche breakdown current flow characteristic and comprising base, emitter and collector electrodes, a capacitor connected in series circuit relationship with said emitter and collector electrodes, means for energizing said series circuit thereby to produce a given charge condition in said capacitor upon avalanche breakdown current flow in said transistor, and means alternately to initiate avalanche breakdown in said transistor and to produce an opposite charge condition in said capacitor, said latter means comprising a second transistor having base, emitter and collector electrodes, an inductance connected in series circuit arrangement with said last mentioned emitter and collector electrodes and said capacitor and means for energizing said series circuit arrangement, means for connecting said inductor to the base of said first transistor, means for maintaining said second transistor normally conducting thereby to produce said opposite charge condition in said capacitor, means for interrupting said conduction of said second transistor thereby to induce a potential in said inductance actuating said first transistor and producing avalanche breakdown thereof, and output means coupled to said first series circuit for deriving a pulse signal as determined by said avalanche breakdown current flow.

3. A pulse generator as claimed in claim 2 wherein said capacitor is contained in the emitter circuit of said first transistor and said inductance is further connected to the emitter of said first transistor.

4. A pulse generator as claimed in claim 2 further comprising means for stabilizing the voltage across said capacitor during the conduction period of said second transistor.

5. A pulse generator as claimed in claim 4 wherein said voltage stabilizing means comprises a silicon diode having a low pass resistance and an inherent capacitance low in value relative to that of said capacitor .

6. A pulse generator comprising a transistor having an avalanche breakdown current flow characteristic and comprising base, emitter and collector electrodes, a capacitor connected in series circuit relationship with said emitter and collector electrodes with one terminal connected to the emitter, means for energizing said series circuit thereby to produce a given charge condition in said capacitor upon avalanche breakdown current flow in said transistor, and means alternately to initiate avalanche breakdown in said transistor and to produce an opposite charge condition in said capacitor, said latter means comprising a second transistor having base, emitter and collector electrodes, an inductance connected in series circuit arrangement with said last mentioned emitter and collector electrodes and said capacitor and means for energizing said series circuit arrangement, diode means interconnecting said inductor and the base of said first transistor, means for maintaining said second transistor normally conducting thereby to produce said opposite charge condition in said capacitor, means for interrupting said normal conductance of said second transistor thereby to induce a potential in said inductance and energize said first transistor to the avalanche condition, and output means coupled to said first series circuit for deriving a pulse signal as determined by said avalanche breakdown current flow.

7. A pulse generator as claimed in claim 6 further comprising a second inductor interconnecting the base and emitter electrodes of said first transistor.

8. A pulse generator comprising a transistor having an avalanche breakdown current flow characteristic and comprising base, emitter and collector electrodes, a capacitor connected in series circuit relationship to said emitter and to one terminal of an energizing source thereby to produce a given charge condition in said capacitor upon avalanche breakdown in said transistor, a diode connected in shunt with said capacitor, and means alternately to initiate avalanche breakdown in said transistor and to produce an opposite charge condition in said capacitor, said latter means comprising a second transistor having base, emitter and collector electrodes, an inductance interconnecting said capacitor and the collector of said second transistor, a diode interconnecting the base of said first transistor and the collector of said second transistor, means maintaining said second transistor normally conducting thereby to produce said opposite charge condition in said capacitor comprising a resistor interconnecting the emitter of said second transistor and one terminal of an energizing source for said second transistor and a diode interconnecting the emitter and base electrodes of said second transistor, means for interrupting said normal conductance of said second transistor thereby to induce a potential in said inductance and energize said first transistor to the avalanche condition, and output means coupled to the emitter-collector circuit of said first transistor for deriving a pulse signal as determined by said avalanche breakdown current flow.

References Cited by the Examiner

UNITED STATES PATENTS

| | | | |
|---|---|---|---|
| 3,017,519 | 1/1962 | Dill | 307—88.5 |
| 3,080,489 | 3/1963 | White | 307—88.5 |
| 3,114,056 | 12/1963 | Berge | 307—88.5 |
| 3,141,981 | 7/1964 | Henebry | 307—88.5 |

ARTHUR GAUSS, *Primary Examiner.*

R. H. EPSTEIN, *Assistant Examiner.*